United States Patent [19]
Baucom et al.

[11] Patent Number: 5,557,500
[45] Date of Patent: Sep. 17, 1996

[54] HEAT DISSIPATING ARRANGEMENT IN A PORTABLE COMPUTER

[75] Inventors: Allan S. Baucom, Townsend; Mark J. Foster, Acton; Michele Bovio, Boston, all of Mass.

[73] Assignee: Digital Equipment Corporation, Maynard, Mass.

[21] Appl. No.: 350,876

[22] Filed: Dec. 7, 1994

[51] Int. Cl.⁶ .................................................. H05K 7/20
[52] U.S. Cl. ........................ 361/687; 361/704; 361/719
[58] Field of Search .................................. 165/80.3, 185; 364/708.1; 361/680, 687, 704, 705, 707, 711, 712, 717–719, 736, 752, 784, 785, 790

[56] References Cited

U.S. PATENT DOCUMENTS

| | | | |
|---|---|---|---|
| 4,535,385 | 8/1985 | August | 361/711 |
| 4,729,061 | 3/1988 | Brown | 361/386 |
| 5,138,523 | 8/1992 | Benck | 361/386 |
| 5,313,362 | 5/1994 | Hatada | 361/709 |
| 5,402,311 | 3/1995 | Nakajima | 361/711 |
| 5,424,913 | 6/1995 | Swindler | 361/687 |

Primary Examiner—Gerald P. Tolin
Attorney, Agent, or Firm—James F. Thompson; Ronald C. Hudgens; Arthur W. Fisher

[57] ABSTRACT

A heat dissipating arrangement in a portable computer uses a copper slug disposed between a heat-generating central processing unit (CPU) chip and the underside of a metallic keyboard baseplate. The slug also extends through a copper-plated hole in a printed circuit (PC) board, and is either soldered to the copper plating or press-fit into the hole to enhance heat transfer between the slug and the PC board. Small through-holes extend through the PC board and the copper plating next to the opening. These through-holes connect the copper plating to several layers of etch within the PC board, so that these layers act like fins on a heat sink to increase heat transfer away from the CPU.

21 Claims, 4 Drawing Sheets

HEAT DISSIPATING ARRANGEMENT IN A PORTABLE COMPUTER

FIELD OF THE INVENTION

The present invention relates to the field of mechanical design of electronic assemblies such as portable computers, and especially to aspects of mechanical design that relate to achieving desirable heat-transfer characteristics in the assembly.

BACKGROUND OF THE INVENTION

In any electronic assembly, it is necessary to provide adequate cooling for heat-generating electronic components to maintain their temperatures within acceptable limits. Failure to maintain proper component temperature can result in incorrect operation as well as reduced component lifetime. In the case of a packaged integrated circuit, the temperature limit is often specified as a maximum "case" temperature, i.e., the maximum allowed temperature of the exterior surface of the package. Maintaining the case below this temperature ensures that the semiconductor devices on the integrated circuit within the package operate below a corresponding acceptable maximum temperature.

A very common and effective way of cooling electronics assemblies is forced-air convection cooling, in which a fan is used to blow cool air over heat-generating components. In many types of electronics assemblies, however, such a cooling scheme is not feasible. For example, portable electronics assemblies, such as portable computers, are generally designed for compactness. These assemblies cannot afford the luxury of space for air flow, a bulky fan, and the need for a bigger power supply to power the fan.

An alternative cooling scheme that is generally used in compact electronics assemblies is conduction cooling. In this scheme, heat from heat-generating devices is conducted away via thermally-conductive structures that contact the devices. An example might be a metal heatsink member that channels heat from an integrated circuit to the frame of an enclosure. The heat is then channeled to larger, exposed areas of the assembly, which in turn can be cooled by passive convection, i.e., exposure to ambient air, or by radiation of the heat into free space.

While conduction cooling is effective and widely used in compact assemblies, it is generally not as efficient as convection cooling. As a result, devices used in compact assemblies generally are not allowed to generate as much heat as they might when used in larger, convection-cooled assemblies. This limitation on heat generation directly translates to a limitation on the power consumption of the devices. This power limitation in turn becomes a limitation on the functional density and speed of the devices, because as a generally rule a denser, faster device consumes more power. This is particularly true regarding digital logic devices such as central-processing unit (CPU) chips. Accordingly, compact electronics assemblies typically have lower performance than larger, convection-cooled assemblies having otherwise similar components. A good example of this dichotomy is the performance distinction between desktop and portable personal computers.

In order to increase the performance of compact electronics assemblies, then, the mechanical designer is challenged to increase conductive cooling efficiency so that higher-power devices may be used. It is to this general problem of improving the conductive cooling of heat-generating devices that the present invention is directed.

SUMMARY OF THE INVENTION

It is an object of the invention to improve the conductive cooling of a heat-generating integrated circuit, such as a CPU chip, in an electronic assembly such as a portable computer. It is also an object to do so without adding significantly to the mechanical complexity or cost of the assembly.

In a broad sense, the invention is an electronic assembly, such as a portable computer, having the following elements: (1) a first printed circuit board having an opening and a layer of thermally-conductive etch adjacent the opening; (2) a second printed circuit board having an integrated circuit mounted on it, the second printed circuit board being disposed relative to the first printed circuit board such that the integrated circuit is substantially aligned with the opening in the first printed circuit board; and (3) a thermally-conductive slug disposed in the opening of the first printed circuit board, the slug being in thermally-conductive contact with the integrated circuit and with the layer of etch in the first printed circuit board to effect heat transfer therebetween. The slug may be soldered to the first printed circuit board or alternatively force-fit into the opening. In one embodiment, the second printed circuit board is a daughtercard that is electrically and mechanically coupled to the first printed circuit board. This broad aspect of the invention has improved heat conduction because it exploits the heat-sinking ability of the etch layer of the first printed-circuit board. And because this etch layer is already present for electrical purposes, the overall cost and complexity of the assembly is not significantly increased.

Although the invention may be used with only one etch layer, another feature enables the use of multiple etch layers to further increase heat conduction. According to this aspect, the invention includes plated through-holes, referred to as "thermal vias", that conduct heat to all etch layers to which they are connected. This aspect has an advantage analogous to the addition of more fins in a heatsink, i.e., greater dispersal of heat in the printed circuit board and thus greater conduction efficiency.

Another aspect of the invention is the inclusion of a thermally-conductive plate disposed on the opposite side of the first printed circuit board from the integrated circuit in thermally-conductive contact with the thermally-conductive slug. This feature increases heat conduction away from the integrated circuit. In one embodiment, the thermally-conductive plate is the metallic baseplate of a keyboard assembly. This feature finds particular use in portable computer or other compact computer assemblies. Another feature is the inclusion of a bolt extending through the daughtercard and the printed circuit board and into the baseplate of the keyboard to urgingly secure the baseplate, the slug, and the integrated circuit together to maximize heat transfer.

Apparatus according to the invention has improved heat conduction away from the heat-generating integrated circuit, and thus enables the use of higher-powered devices in a conductively-cooled assembly without increasing case temperatures beyond acceptable limits. It also achieves these advantages by making use of heat-sinking structures already present in an electronic assembly, and thus does not appreciably add to the cost or complexity of the assembly. Other features and advantages of the present invention will be apparent to those skilled in the art in light of the detailed description below.

BRIEF DESCRIPTION OF THE DRAWINGS

An embodiment of the invention will be described with reference to the accompanying drawings, in which.

DETAILED DESCRIPTION

Figure 1:
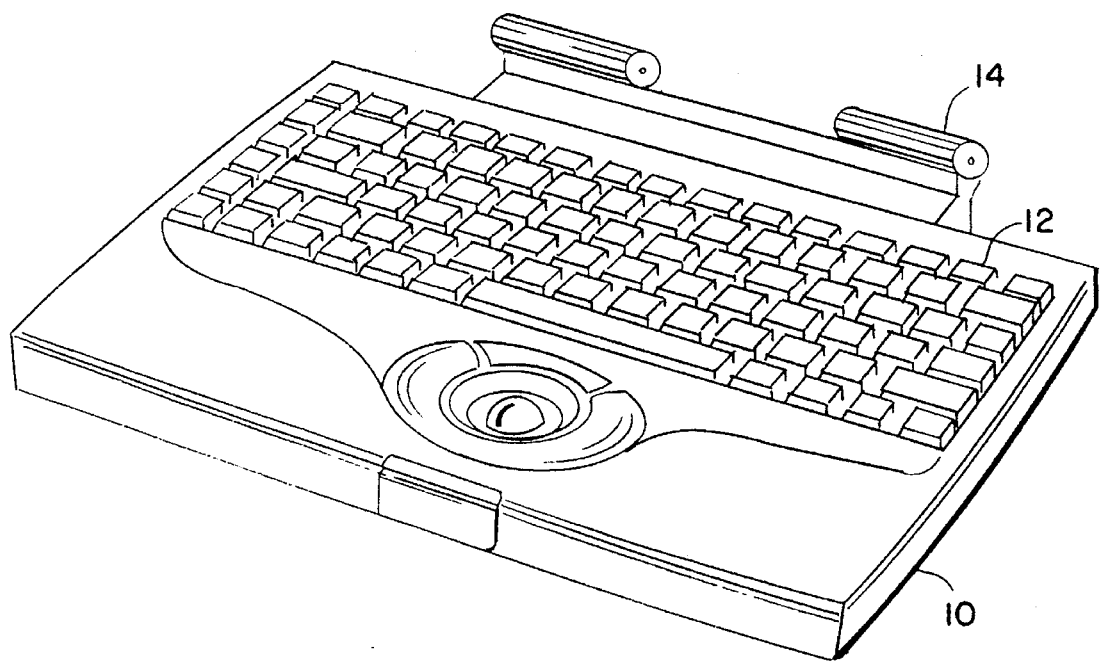
FIG. 1 is a front perspective view of the base portion of a portable notebook computer having a heat dissipating arrangement according to the principles of the present invention.

FIG. 1 shows the base portion of a portable notebook computer having a plastic housing 10 and a keyboard 12. The housing 10 has a rear hinge portion 14 for the attachment of a display panel, which is not shown.

Figure 2:
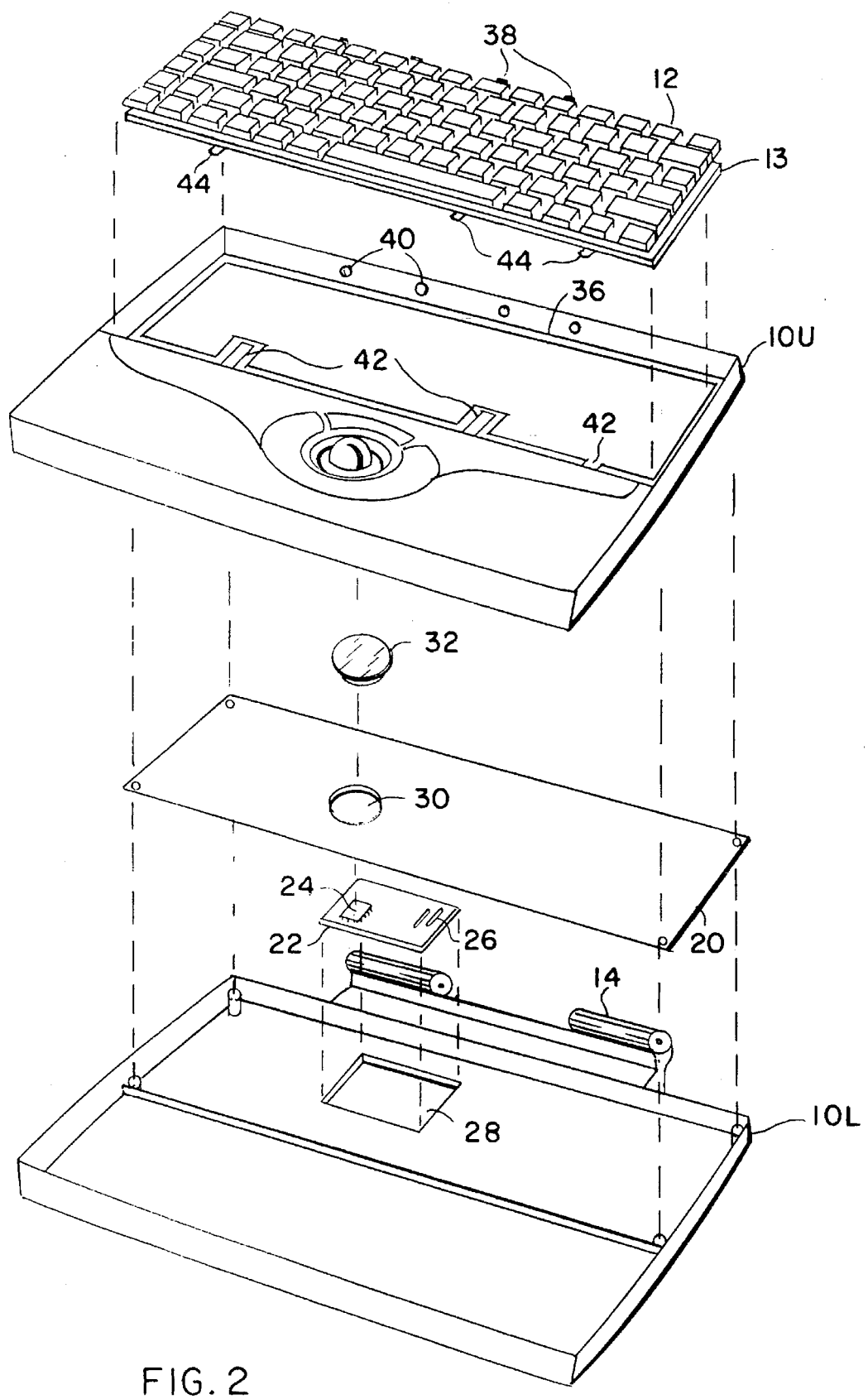
FIG. 2 is an exploded perspective assembly view of the base portion of the notebook computer of FIG. 1.

The exploded view of FIG. 2 shows that the housing 10 comprises a lower housing piece 10L and an upper housing piece 10U. The keyboard 12 is removably attached to the upper housing piece 10U by means described below. The keyboard 12 is constructed primarily of plastic, but also has an aluminum baseplate 13 its bottom to increase its rigidity. A printed circuit (PC) board 20 holding various electronic circuitry is mounted to the lower housing piece 10L. A daughtercard 22 is attached to the underside of the PC board 20. The daughtercard 22 has a central processing unit (CPU) chip 24 and connectors 26. The connectors 26 engage mating connectors on the underside of the PC board 20 (not shown in FIG. 2) to establish electrical connections between the CPU 24 and the circuitry on the PC board 20. The daughtercard 22 is accessible via an opening 28 in the lower housing piece 10L when an access cover (not shown) is removed. This accessibility enables easy replacement of the daughtercard 22 for purposes of maintenance or upgrade.

The PC board 20 has a circular opening 30 aligned with the CPU 24, and a generally cylindrical copper slug 32 disposed in the opening. The slug 30 is shaped and dimensioned to extend through the opening 30 so that the bottom surface of the slug 30 contacts the top of the CPU 24 when the daughtercard 22 is fully seated on the underside of the PC board 20. The top surface of the slug 32 extends above the top surface of the PC board 20 to contact the aluminum baseplate 13 of the keyboard 12. Conventional thermal grease is used between the top of the slug 32 and the keyboard baseplate as well as between the bottom of the slug 32 and the CPU 24.

The keyboard 12 and upper housing piece 10U have several features that cooperate to retain the keyboard 12 on the upper housing piece 10U. The upper housing piece 10U has a recessed keyboard support flange 36 that supports the keyboard 12 around its perimeter. A set of small tabs 38 at the rear of the keyboard engage corresponding slots 40 formed in the rear part of the upper housing piece 10U. The keyboard support flange 36 has three slots 42 formed in its front portion to accept corresponding latches 44 on the keyboard. The keyboard 12 is attached to the upper housing portion 10U by first placing the rear of the keyboard 12 on the rear part of the support flange 36 so that the tabs 38 slightly engage the corresponding slots 40; bringing the front of the keyboard 12 down so that the latches 44 are within slots 42; and then sliding the latches 44 forward to engage the underside of the upper housing piece 10U.

Figure 3:
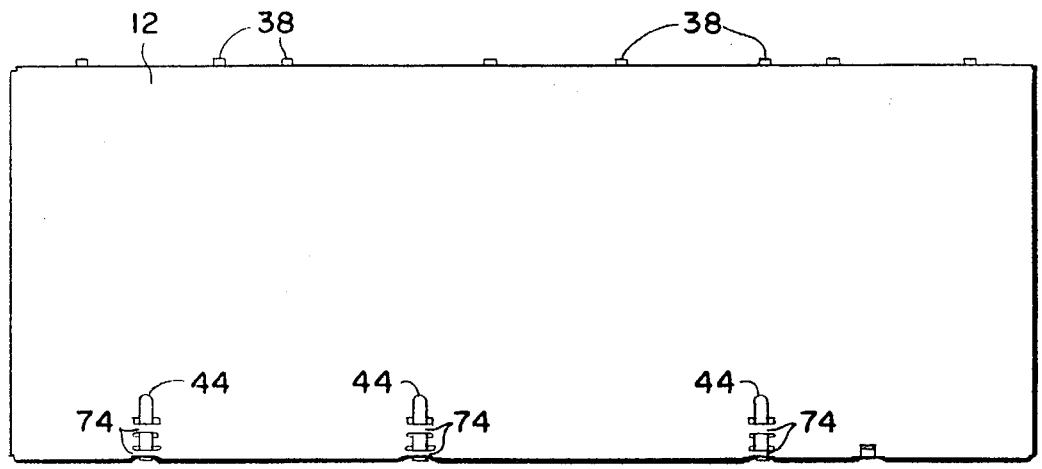
FIG. 3 is a bottom plan view of a keyboard that is part of the assembly of FIG. 2.

FIG. 3 shows the underside of the keyboard 12. Each latch 44 is a flat piece of plastic that is retained by arched protrusions 74 of the keyboard baseplate. The latches 44 are shown in the unlocked position. When the latches are slid forward, they engage the underside of the upper housing piece 10U of FIG. 2 to retain the keyboard. A small hole 76 in the tongue receives a small pin or similar tool (not shown) that can be used to lock and unlock the latch 44 by sliding it between the locked and unlocked positions.

Figure 4:
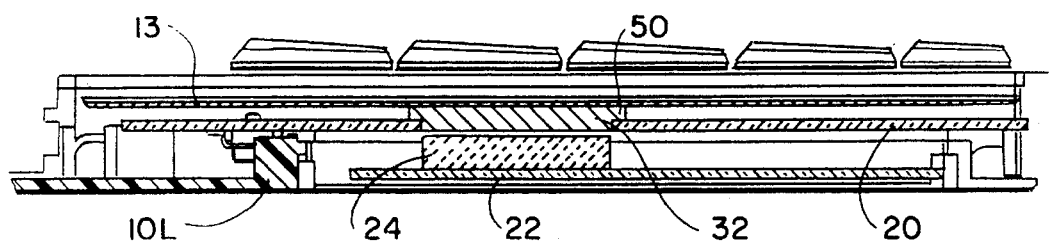
FIG. 4 is a side section unexploded view of a portion of the assembly of FIG. 2.

FIG. 4 shows a cross-sectional view of a portion of the assembly shown in FIG. 2. As shown, the thermal slug 32 is generally cylindrical and has an upper lip or flange portion 50 that extends beyond the boundary of the opening 30 in the PC board 20. This flange 50 helps assure correct seating of the slug 32 during assembly, and also increases the amount of the surface area of the slug 32 that is contacting the PC board 20 so that thermal coupling therebetween is increased.

Figure 5:
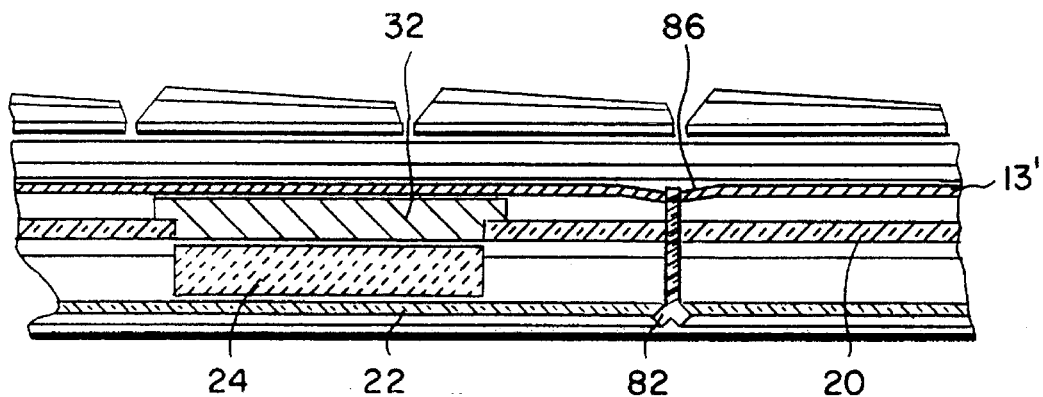
FIG. 5 is a side section view like that of FIG. 4 but showing additional features according to an alternative embodiment.
Figure 6:
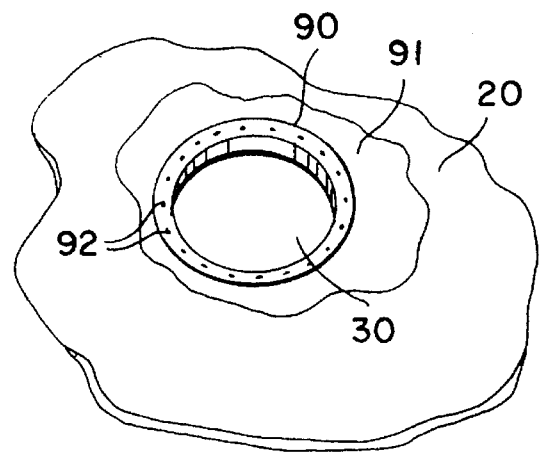
FIG. 6 is a perspective view of a portion of a printed circuit board that is part of the assembly of FIG. 2.

FIG. 5 shows an arrangement for securing the various components of FIG. 4 together. A slightly modified keyboard baseplate 13' has a protrusion 80 with a tapped hole formed therein. A bolt 82 extends through the daughtercard 22 and the printed circuit board 20, and into the tapped hole of the protrusion 80. This arrangement causes the baseplate 13', slug 32, and CPU 24 to be urged together to ensure optimal heat transfer therebetween. It may be desirable in alternative embodiments to use a nut adhered to the underside of the keyboard baseplate 13' to accept the bolt FIG. 6 shows a portion of the area of the PC board 20 around the opening 30 in greater detail. As shown, the sides of the opening 30 as well as the area immediately surrounding it are plated with a layer of copper 90. This copper layer contacts a layer of etch 91 on the top of the PC board 20 that serves as an electrical reference plane, such as a ground plane. Several through-holes 92 extend through the PC board 20 in this plated area. The sides of the through-holes 92 are also plated with copper. The through-holes 92 thus form "thermal vias" that effect heat transfer vertically through the PC board 20. The through-holes 92 also thermally couple together layers of etch in various layers of the PC board 20, so that heat is conducted into as many layers as possible. In this manner, these etch layers of the PC board 20 act like additional fins on a heatsink to increase the conduction of heat away from the CPU 24.

Although the embodiment of FIG. 6 shows that the top of the PC board 20 has an electrical reference plane layer 91, this need not be the case in alternative embodiments. Of course it is desirable that as many layers as possible be thermally coupled to the slug 32 to maximize heat conduction. However, the present invention does not require that any particular layer be used as a "fin". The illustrated use of thermal vias 92 increases flexibility in this regard.

The slug 32 may be soldered to the copper layer 90 to improve both mechanical and thermal bonding. If the slug 32 is so soldered, it is advantageous to plate the slug 32 with an alloy such as a conventional solder alloy to improve its solderability. The slug 32 may also be press-fit into the opening 30 without soldering. It is advantageous in such a case to knurl the outer edge of the lower portion of the slug to enhance frictional bonding between the slug 32 and the sides of the opening 30.

While the foregoing has described an embodiment of the present invention, other embodiments are possible within its scope as described by the following claims.

What is claimed is:

1. Apparatus, comprising:

a first printed circuit board having an opening therein and a layer of thermally-conductive etch adjacent said opening, the sides of said opening being plated with a thermally-conductive material, said layer of etch being in thermally-conductive contact with said thermally-conductive material;

a second printed circuit board having an integrated circuit mounted thereon, said second printed circuit board being disposed relative to said first printed circuit board such that said integrated circuit is substantially aligned with said opening in said first printed circuit board; and a thermally-conductive slug disposed in said opening of said first printed circuit board in contact with the plated sides thereof, said slug in said first printed circuit board being in physical contact and in a thermally-conductive relationship with said integrated circuit on said second printed circuit board and in a thermally-conductive relationship with said layer of etch in said first printed circuit board to effect heat transfer therebetween.

2. Apparatus according to claim 1, wherein said thermally-conductive slug is soldered to the plating of said opening.

3. Apparatus according to claim 1, wherein said thermally-conductive slug is force-fit into said opening.

4. Apparatus according to claim 1, wherein said plating material extends to a portion of an outer surface of said first printed circuit board surrounding said opening, and wherein said thermally-conductive slug is generally cylindrical in shape and has an upper flange portion overlapping said surrounding portion of said outer surface and contacting the portion of said plating material thereon.

5. Apparatus according to claim 1, wherein said second printed circuit board is a daughtercard electrically and mechanically coupled to said first printed circuit board.

6. Apparatus, comprising:

a first printed circuit board having an opening therethrough and a layer of thermally-conductive etch adjacent said opening, the sides of said opening being coated with a thermally-conductive material, said layer of etch being in thermally-conductive relationship with said thermally-conductive material;

a second printed circuit board having an integrated circuit mounted thereon, said second printed circuit board being disposed adjacent one side of said first printed circuit board such that said integrated circuit is substantially aligned with said opening in said first printed circuit board;

a thermally-conductive slug disposed in said opening of said first printed circuit board in thermally-conductive contact with the coated sides thereof, said thermally-conductive slug being in a thermally-conductive relationship with said integrated circuit; and a thermally-conductive plate, being different in kind from said integrated circuit, disposed on the opposite side of said first printed circuit board from said second printed circuit board and being in a thermally-conductive relationship with said thermally-conductive slug to effect heat transfer between said integrated circuit on said second printed circuit board and said plate.

7. Apparatus according to claim 6, wherein said thermally-conductive plate is a rigid base plate of a keyboard disposed on the opposite side of said first printed circuit board from said integrated circuit.

8. Apparatus, comprising:

a housing;

a printed circuit board secured to said housing, said printed circuit board having an opening therethrough and a layer of thermally-conductive etch adjacent said opening, the sides of said opening being coated with a thermally-conductive material, said layer of etch being in a thermally-conductive relationship with said thermally-conductive material;

a thermally-conductive slug disposed in said opening of said printed circuit board in thermally-conductive contact with the plated sides thereof, said slug being in a thermally-conductive relationship with said layer of etch;

a keyboard attached to said housing closely spaced apart from one side of said printed circuit board, said keyboard having a thermally-conductive baseplate at the underside thereof in a thermally-conductive relationship with said thermally-conductive slug; and an integrated circuit disposed on the other side of said printed circuit board from said baseplate, said integrated circuit being substantially aligned with said opening and in a thermally-conductive relationship with the other end of said thermally-conductive slug to effect heat transfer between said integrated circuit and said baseplate.

9. Apparatus according to claim 8, further comprising a daughtercard on which is mounted said integrated circuit, said daughtercard being electrically and mechanically coupled to said printed circuit board, and wherein said housing has an opening larger than and substantially aligned with said daughtercard to enable the removal thereof from the apparatus.

10. Apparatus according to claim 8, further comprising a daughtercard on which is mounted said integrated circuit, said daughtercard being electrically and mechanically coupled to said printed circuit board, and further comprising a bolt extending through said daughtercard and said printed circuit board and into said baseplate of said keyboard to urgingly secure said baseplate, said slug, and said integrated circuit together.

11. Apparatus, comprising:

a first printed circuit board having an opening therethrough and a layer of thermally-conductive etch adjacent said opening, the sides of said opening being coated with a thermally-conductive material, said layer of etch being in a thermally-conductive relationship with said thermally-conductive material;

a thermally-conductive slug disposed in said opening of said first printed circuit board, said slug being in a thermally-conductive relationship with said coated sides of said opening and with said layer of etch;

a second printed circuit board having an integrated circuit mounted thereon, said second printed circuit board being disposed relative to said first printed circuit board such that said integrated circuit is substantially aligned with said opening in said first printed circuit board; and a layer of thermal grease being interposed between and in physical contact with said thermally-conductive slug in said opening of said first printed circuit board and said integrated circuit on said second printed circuit board for transferring heat therebetween.

12. Apparatus according to claim 11, wherein said first printed circuit board has a plurality of through-holes extending through said first printed circuit board adjacent said opening, the sides of said through-holes being coated with said thermally-conductive material to form thermal vias that effect heat transfer through said first printed circuit board.

13. Apparatus according to claim 12, wherein said through-holes are in a thermally-conductive relationship with said layer of etch to effect heat transfer between said layer of etch and said through-holes.

14. Apparatus according to claim 12, wherein said coating material extends to an outer surface of said first printed circuit board surrounding said opening, and said slug has a upper flange portion that overlaps said through-holes and is in thermally-conductive relationship with said coating material for effecting heat transfer between said slug and said through-holes.

15. Apparatus according to claim 11, wherein said thermally-conductive slug is soldered to the coating of said opening.

16. Apparatus according to claim 11, wherein said thermally-conductive slug is force-fit into said opening.

17. Apparatus according to claim 11, wherein said coating material extends to a portion of an outer surface of said first printed circuit board surrounding said opening, and wherein said thermally-conductive slug is generally cylindrical in shape and has an upper flange portion overlapping said surrounding portion of said outer surface and contacting the portion of said coating material thereon.

18. Apparatus according to claim 11, wherein said second printed circuit board is a daughtercard electrically and mechanically coupled to said first printed circuit board.

19. Apparatus according to claim 1, wherein said first printed circuit board has a plurality of through-holes extending through said first printed circuit board adjacent said opening, the sides of said through-holes being coated with said thermally-conductive material to form thermal vias that effect heat transfer through said first printed circuit board.

20. Apparatus according to claim 19, wherein said through-holes are in thermally-conductive relationship with said layer of etch to effect heat transfer between said layer of etch and said through-holes.

21. Apparatus according to claim 19, wherein said plating material extends to an outer surface of said first printed circuit board surrounding said opening, and said slug has an upper flange portion that overlaps said through-holes and is in thermally-conductive relationship with said plaing material for effecting heat transfer between said slug and said through-holes.

* * * * *